Nov. 5, 1968 L. R. SHIOZAWA 3,409,464

PIEZOELECTRIC MATERIALS

Filed April 29, 1964

INVENTOR.
LEBO R. SHIOZAWA

BY James A. Smith

ATTORNEY

United States Patent Office 3,409,464
Patented Nov. 5, 1968

3,409,464

PIEZOELECTRIC MATERIALS

Lebo R. Shiozawa, Richmond Heights, Ohio, assignor to Clevite Corporation, a corporation of Ohio Filed Apr. 29, 1964, Ser. No. 363,369
9 Claims. (Cl. 117—201)

ABSTRACT OF THE DISCLOSURE

A piezoelectric body is formed from polycrystalline non-ferroelectric materials composed of Class II–VI dihexagonal polar crystals and selected from the group consisting of cadmium sulfide, cadmium selenide, zinc oxide, beryllium oxide, wurtzite zinc sulfide and solid solutions thereof. The body is formed by subliming material in a first temperature zone and vapor depositing the sublimed material on a surface in a second lower temperature zone. An electromechanical transducer in accordance with one embodiment of the invention comprises a substrate having a layer of piezoelectric material vapor deposited thereon. Reference is made to the claims for a legal definition of the invention.

This invention relates to piezoelectric materials and, particularly, to piezoelectric polycrystalline materials composed of non-ferroelectric crystallites, the method of making the same, and articles of manufacture embodying said materials.

When a compound belonging to a piezoelectric crystal class is fabricated into a polycrystalline body, the piezoelectric response of each crystallite will in general be cancelled or opposed by the response of another so that the body does not have a net piezoelectric response. In the case of ferroelectric materials the opposed response of the randomly oriented crystallites can be substantially overcome by electrically orienting the ferroelectric axis of each crystallite in the most favorable direction permitted by the crystal symmetry of the material. As is well known to those skilled in the art, ferroelectric ceramic materials such as barium titanate and lead zirconate-lead titanate may be readily oriented in this manner to result in a substantial net piezoelectric response.

In the case of non-ferroelectric materials electrical orientation of the randomly oriented crystallites cannot be accomplished. For this reason non-ferroelectric polycrystalline materials have been heretofore unsuitable as piezoelectric materials.

I have found that a preferred crystalline orientation can be mechanically accomplished by non-electric means in non-ferroelectric polycrystalline materials composed of Class II–VI dihexagonal polar crystals. It is accordingly a principal object of the present invention to produce a piezoelectric response of substantial magnitude in a non-ferroelectric polycrystalline material composed of Class II–VI dihexagonal polar crystals.

Another object of the invention is to provide a non-ferroelectric polycrystalline body of material selected from the group consisting of cadmium sulfide, cadmium selenide, zinc oxide, beryllium oxide, wurtzite zinc sulfide and solid solutions thereof having a substantial net piezoelectric response.

Another object of the invention is to provide an electromechanical transducer comprising a piezoelectric body of non-ferroelectric polycrystalline material selected from the group consisting of cadmium sulfide, cadmium selenide, zinc oxide, beryllium oxide, wurtzite zinc sulfide and solid solutions thereof.

Another object of the invention is to provide an improved transducer for high frequency applications.

Another object of the invention is to provide a method of forming a polycrystalline body of material selected from the group consisting of cadmium sulfide, cadmium selenide, zinc oxide, beryllium oxide, wurtzite zinc sulfide and solid solutions thereof such that the individual crystallites have a substantial polar orientation and the body possesses a substantial net piezoelectric response.

In accordance with the invention a supply of monocrystalline or polycrystalline material composed of Class II–VI dihexagonal polar crystals is sublimed in a high temperature zone and vapor deposited on a surface in a lower temperature zone. The deposited layer thus formed is polycrystalline and composed of crystallites having a preferred orientation of their crystallographic *c* axes with respect to both polarity and direction.

Other objects and advantages will become apparent from the following description taken in connection with the accompanying drawing wherein.

Figure 1:
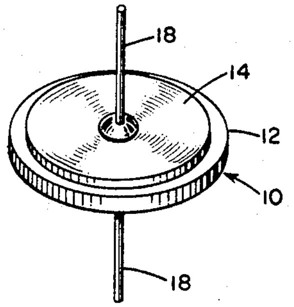
FIGURE 1 is a perspective view of an electromechanical transducer embodying the invention.

Referring to FIGURE 1 of the drawing, there is shown an electromechanical transducer 10 having as its active element, a body 12 of piezoelectric material according to the present invention. The body 12 is provided with a pair of electrodes 14 on opposite surfaces thereof and a pair of lead wires 18 for circuit connection of the electrodes.

As is well-known in the art, an electromechanical transducer operates to convert applied electrical energy to mechanical energy and vice versa. Therefore, if the ceramic body 12 is subjected to mechanical stresses, the resulting strain generates an electrical output appearing as a voltage between lead wires 18. Conversely, a voltage applied between the lead wires 18 produces a strain or mechanical deformation of ceramic body 12.

The transducer 10 depicted in FIGURE 1 may also be utilized as a piezoelectric filter resonator element, frequency control device, delay lines, etc. A signal voltage applied between electrodes 14 causes the body 12 to vibrate at frequencies and with amplitudes corresponding to the signal voltage in a vibrational mode dependent on the orientation of the piezoelectric axis with respect to the electrodes 14.

In accordance with the present invention the body 12 of transducer 10 comprises non-ferroelectric polycrystalline material which possesses a strong net piezoelectric response. A substantial polar orientation of the crystallites is uniquely achieved by the sublimation and vapor deposition process hereinafter described.

Within the scope of the invention are polycrystalline non-ferroelectric materials composed of II–VI compounds belonging to the crystal class designated as dihexagonal polar (6 mm.) such as cadmium sulfide, cadmium selenide, zinc oxide, beryllium oxide, zinc sulfide (crystal form known as wurtzite). Preferred materials are those comprising cadmium sulfide and the invention will be disclosed in reference thereto. It will be apparent to those skilled in the art, however, that all of the compounds named within the stated crystal class and solid solutions of such compounds are operative by reason of their similar properties and crystal structure and therefore are encompassed by the invention.

Figure 2:
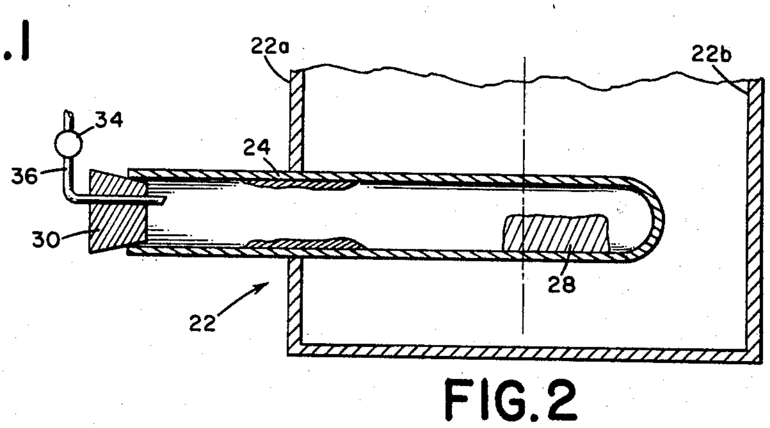
FIGURE 2 is a schematic illustration of apparatus utilized in the preparation of piezoelectric non-ferroelectric polycrystalline material in accordance with the invention.

Referring specifically to FIGURE 2 of the drawing, there is shown schematically a typical furnace indicated generally by the reference numeral 22. The furnace 22 is preferably heated at its center region to establish a high temperature sublimation zone and a lower temperature vapor deposition zone adjacent the front wall 22*a*, the temperature profile being shown schematically in FIGURE 3.

The apparatus illustrated in FIGURE 2 further includes a fused quartz tube 24 supported in a suitable opening in the front furnace wall 22*a* as shown. A supply of high purity cadmium sulfide starting material 28 is positioned in the quartz tube adjacent the sealed end thereof near the center line of the furnace.

The cadmium sulfide starting material 28 may be polycrystalline or monocrystalline material and comprise a solid piece or compacted granular particles. Preferably the starting material is of high purity particularly with respect to donor impurities which tend to increase conductivity.

The open end of the tube 24 is sealed by a plug 30 exteriorly of the furnace and connected to a mechanical vacuum pump 34 by a conduit 36. The pump 30 is continuously operated during the process hereinafter described to maintain a vacuum condition within the tube 24.

In operation of the apparatus depicted in FIGURE 2 sublimation of the material 28 occurs in the high temperature zone at the center of the furnace, followed by vapor deposition of material on the walls of the quartz tube 24 in the lower temperature zone adjacent the front furnace wall 22*a*.

Figure 3:
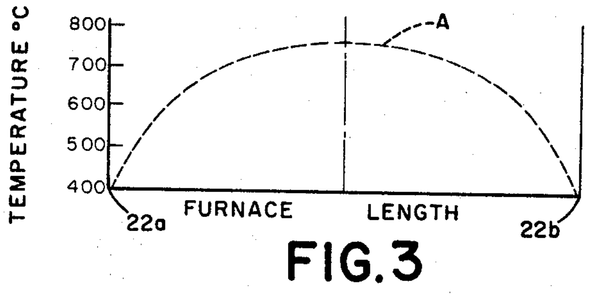
FIGURE 3 is a curve illustrating the temperature profile in the furnace depicted in FIGURE 2.

The temperature conditions within the furnace 22 during the vacuum deposition process are not critical except that at very low sublimation temperatures (less than 400° C.) the sublimation rate would be impractically low. At very high sublimation temperatures (higher than 1000° C.) the deposition rate would be too high rendering the process difficult to control. Vapor deposition of the sublimed material can occur over a range of temperatures between room temperature and a temperature less than the maximum furnace temperature dependent upon the pressure condition within the furnace. The size of the crystallites in the deposited layers has been found to be dependent on deposition temperature, the largest crystallites forming in the high temperature region of the deposition zone. Suitable temperature conditions within the furnace 22 for the process described are a constant maximum temperature of 800° C. at the center of the furnace and constant temperatures of from 300–400° C. at the front and rear walls as indicated in FIGURE 3.

The pressure conditions within furnace 22 are also not critical and a pressure less than one atmosphere is satisfactory. Preferably, however, a pressure less than 1 mm. of mercury is maintained by pump 34. By lowering the pressure, the deposition can be made to occur in a lower temperature zone. Thus, the location of the deposit and the deposition temperature can be controlled by varying the pressure.

The process described results in a dense, polycrystalline layer of cadmium sulfide having high mechanical strength and which can be separated from the wall of the quartz tube 24. A layer thus formed is composed of acicular crystallites having diameters of about 0.1 mm. and less, dependent on deposition temperature, and a length equal to the full thickness of the deposited layer. The crystallographic *c* axes of the crystallites are uniformly oriented approximately perpendicular to the walls of the quartz tube 24 and parallel to the direction of heat flow during the deposition process. A novel feature of the material thus formed is that the sense of the crystallographic *c* axes is also substantially oriented imparting to the body as a whole a polar characteristic. In the case of cadmium sulfide the positive direction (according to the IRE convention) coincides with the direction of growth to impart to the material a substantial net piezoelectric response.

A transducer of the type depicted in FIGURE 1 was fabricated utilizing a body 12 cut from material fabricated in the above described manner. The body was approximately 1 mm. in thickness and electroded perpendicular to the axes of the crystallites. The piezoelectric response was tested by measuring the magnitude and frequency difference of the resonant and antiresonant response in the thickness mode of vibration. A coupling of approximately 8 percent was measured indicating almost perfect orientation of the direction and polarity of the piezoelectric *c* axes.

The exact mechanism by which the uniform orientation is achieved is not clearly understood but believed to be the result of several phenomena such as (1) a natural tendency of cadmium sulfide to establish a crystallographic plane of high reticular density parallel to the substrate, (2) a strong anisotropy of crystal growth rates of (0001 and 000$\bar{1}$) faces, and (3) the presence of a temperature gradient, i.e., a definite direction of heat flow. It is believed that all three factors contribute to the preferred orientation obtained.

Figure 4:
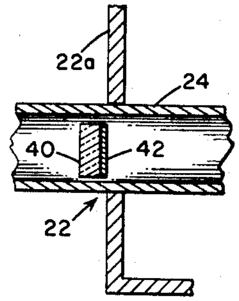
FIGURE 4 is a fragmentary sectional view illustrating a modification of the apparatus depicted in FIGURE 2.

The configuration of the quartz tube 24 illustrated in FIGURE 2 results in a generally cylindrical shaped material deposit as indicated. It will be apparent that by providing a flat surface within the tube 24 a relatively flat deposit can be achieved from which flat transducer disks can be more readily fabricated. Referring to FIGURE 4 there is shown a quartz plate 40 positioned within tube 24 to define a vapor deposition surface 42. The plate 40 is positioned within tube 24 adjacent the front furnace wall 22*a* whereby the sublimed cadmium sulfide material is vapor deposited on surface 42 of plate 40, as shown.

With the structure depicted in FIGURE 4 a relatively flat material deposit is achieved the thickness of which is dependent on deposition time and on the location of the plate 40 relative to the point of maximum vapor deposition. The deposited cadmium sulfide layer obtained is composed of uniformly oriented crystallites having their crystallographic *c* axes oriented prependicular to the surface 42 of plate 40 with the positive ends of the axes oriented away from the surface 42. Thus the deposited material possesses a strong net piezoelectric response.

The invention possesses particular utility in connection with transducers for high frequency applications. As is known to those skilled in the art the resonant frequency of a piezoelectric resonator is dependent on the wafer thickness and increases with decrease in wafer thickness. Heretofore such high frequency resonators have been usually fabricated from quartz. The frequencies obtainable are substantially limited due to the difficulty of fabricating thin quartz wafers. By means of the vapor deposition technique utilized in connection with the present invention an extremely thin piezoelectric layer may be deposited on a supporting substrate to achieve extremely high resonant frequencies.

Figure 5:
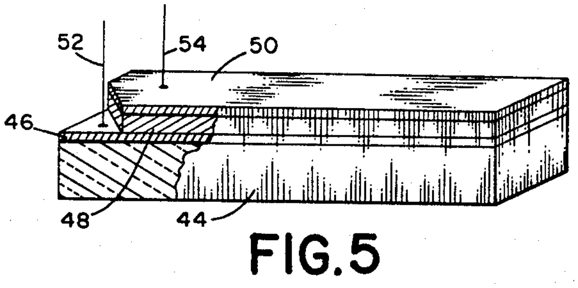
FIGURE 5 is a perspective view in partial section illustrating a thin layer high frequency transducer embodying the invention.

Referring to FIGURE 5 of the drawings a high frequency transducer in accordance with the invention comprises a relatively flat substrate 44 of insulating material such as glass or quartz. The upper surface of the substrate 44 is provided with an electrically conductive coating or electrode 46 on which is vapor deposited a layer 48 of cadmium sulfide by the process herein disclosed. A second electrically conductive coating or electrode 50 is applied to the upper surface of layer 48. To complete the assembly lead wires 52 and 54 are suitably connected to the upper surfaces of electrodes 46 and 50, respectively. To facilitate attachment of lead wire 52 corner portion of layer 48 and electrode 50 are removed such as by etching to expose a portion of the face surface of electrode 46.

In fabrication of the structure shown in FIGURE 5 the electrically conductive coating 46 is first applied to substrate 44 such as by vapor deposition of a suitable metal e.g., aluminum, gold, copper or combinations thereof or by application of a suitable heat resistant electrically conductive paint. These and other suitable electroding techniques are well known to those skilled in the art and further description is deemed unnecessary.

Figure 6:
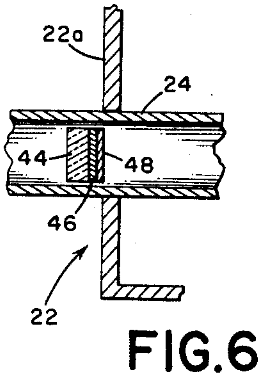
FIGURE 6 is a fragmentary sectional view illustrating the method of making the transducer depicted in FIGURE 5.

The coated substrate is then positioned in tube 24 as illustrated in FIGURE 6 with coating 46 facing the closed end of the tube. When so positioned sublimed cadmium sulfide material will be vapor deposited on the surface of coating 46 as shown.

Upon removal of the substrate 44 from the furnace the second coating 50 is applied in the same manner as the coating 46 prior to attachment of lead wires 52 and 54.

The thickness of the cadmium sulfide layer 48 is dependent on the time period of vapor deposition and also the location of the substrate relative to the center of the vapor deposition zone. One sample fabricated with a layer thickness of 0.065 mm. had a resonant frequency of 35 megacycles. It is apparent that a layer of minute thickness having even higher resonant frequencies can readily be obtained by varying the substrate position or shortening the deposition time.

Figure 7:
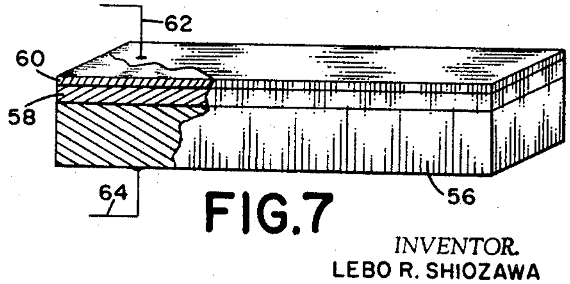
FIGURE 7 is a view similar to FIGURE 5 illustrating another embodiment of a thin layer high frequency transducer.

Referring to FIGURE 7 of the drawings there is shown another embodiment of a thin film high frequency transducer embodying the invention. The transducer depicted in FIGURE 7 comprises a substrate 56 which in this instance is fabricated from electrically conductive material whereby the substrate also serves as one electrode. A layer 58 of piezoelectric material is vapor deposited on one surface of the substrate 56 and an electrode 60 is formed on the surface of layer 58 in the same manner as the layer 46 and electrode 50 shown in FIGURE 5. To complete the assembly lead wires 62 and 64 are connected to the face surfaces of substrate 56 and electrode 50 as shown in FIGURE 7. With the embodiment of FIGURE 7 only one electrode coating is required and the transducer structure is thus basically simpler than that disclosed in FIGURE 5.

It will be apparent that by the vapor deposition process herein disclosed a piezoelectric layer may be readily formed on a curved or irregularly shaped surface of a substrate. Also by selective masking and/or etching desired layer configurations or patterns may be achieved.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and desired to secure by Letters Patent of the United States:

1. A piezoelectric element comprising: a body of polycrystalline non-ferroelectric material composed of Class II–VI dihexagonal polar crystals having their crystallographic *c* axes substantially oriented with respect to both polarity and direction.

2. A piezoelectric element comprising: a body of polycrystalline non-ferroelectric material comprising material selected from the group consisting of cadmium sulfide, cadmium selenide, zinc oxide, beryllium oxide, wurtzite zinc sulfide and solid solutions thereof composed of crystals having their crystallographic *c* axes substantially oriented with respect to both polarity and direction.

3. A piezoelectric element comprising: a vapor deposited layer of polycrystalline non-ferroelectric material comprising material selected from the group consisting of cadmium sulfide, cadmium selenide, zinc oxide, beryllium oxide, wurtzite zinc sulfide and solid solutions thereof composed of crystals having their crystallographic *c* axes substantially oriented with respect to both polarity and direction.

4. An electromechanical transducer comprising: a piezoelectric body of polycrystalline non-ferroelectric material composed of Class II–VI dihexagonal polar crystals having their crystallographic *c* axes substantially oriented with respect to both polarity and direction; and electrode means on opposite surfaces of said body.

5. An electromechanical transducer comprising: a piezoelectric body of polycrystalline non-ferroelectric material selected from the group consisting of cadmium sulfide, cadmium selenide, zinc oxide, beryllium oxide, wurtzite zinc sulfide and solid solutions thereof and composed of crystallites having their crystallographic *c* axes substantially oriented with respect to both polarity and direction; and electrodes on opposite surfaces of said body.

6. A piezoelectric element comprising: polycrystalline non-ferroelectric cadmium sulfide material composed of crystallites having a preferred orientation of their crystallographic *c* axes with respect to both polarity and direction.

7. A piezoelectric element comprising: polycrystalline non-ferroelectric cadmium selenide material composed of crystallites having a preferred orientation of their crystallographic *c* axes with respect to both polarity and direction.

8. A piezoelectric element comprising: polycrystalline non-ferroelectric zinc oxide material composed of crystallites having a preferred orientation of their crystallographic *c* axes with respect to both polarity and direction.

9. An electromechanical transducer comprising: a body of polycrystalline non-ferroelectric cadmium sulfide material composed of crystallites having their crystallographic *c* axes substantially oriented with respect to both polarity and direction; and electrodes on opposite surfaces of said body.

References Cited

UNITED STATES PATENTS

| | | | |
|---|---|---|---|
| 2,445,310 | 7/1948 | Chilowsky | 117—106 |
| 2,688,564 | 9/1954 | Forgue | 117—106 X |
| 2,997,408 | 8/1961 | Heureux | 117—201 |
| 3,065,112 | 11/1962 | Gilles et al. | 117—200 |
| 3,091,707 | 5/1963 | Hutson | 310—8 |
| 3,093,758 | 6/1963 | Hutson | 252—62.9 X |
| 3,094,395 | 6/1963 | Richardson | 23—294 |
| 3,234,488 | 2/1966 | Fair | 252—62.9 X |

FOREIGN PATENTS

| | | |
|---|---|---|
| 1,082,474 | 5/1960 | Germany. |

WILLIAM L. JARVIS, *Primary Examiner.*